United States Patent
Feng

(10) Patent No.: US 9,620,450 B2
(45) Date of Patent: Apr. 11, 2017

(54) DISPLAY SUBSTRATE, MANUFACTURING METHOD THEREOF AND DISPLAY DEVICE

(71) Applicants: Boe Technology Group Co., Ltd., Beijing (CN); Beijing Boe Display Technology Co., Ltd., Beijing (CN)

(72) Inventor: Bin Feng, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/913,327

(22) PCT Filed: Aug. 18, 2015

(86) PCT No.: PCT/CN2015/087367
§ 371 (c)(1),
(2) Date: Feb. 19, 2016

(87) PCT Pub. No.: WO2016/155203
PCT Pub. Date: Oct. 6, 2016

(65) Prior Publication Data
US 2017/0040251 A1 Feb. 9, 2017

(30) Foreign Application Priority Data
Mar. 30, 2015 (CN) .......................... 2015 1 0144882

(51) Int. Cl.
*H01L 23/528* (2006.01)
*G02F 1/1333* (2006.01)
(Continued)

(52) U.S. Cl.
CPC .......... *H01L 23/528* (2013.01); *G02F 1/1333* (2013.01); *G02F 1/1362* (2013.01);
(Continued)

(58) Field of Classification Search
CPC ... H01L 23/528; H01L 27/02; H01L 27/3241; H01L 29/42725; H01L 21/76805
See application file for complete search history.

(56) References Cited

U.S. PATENT DOCUMENTS 7,948,570 B2 * 5/2011 Wang .................... H01L 27/124
349/43
2009/0225249 A1 * 9/2009 Wang .................. H01L 27/1288
349/43

(Continued)

FOREIGN PATENT DOCUMENTS

| CN | 103474472 | 12/2013 |
| CN | 103872061 | 6/2014 |

(Continued)

OTHER PUBLICATIONS

International Search Report and Written Opinion from PCT/CN15/87367 dated Dec. 28, 2015.

*Primary Examiner* — Earl Taylor
(74) *Attorney, Agent, or Firm* — Calfee, Halter & Griswold LLP

(57) ABSTRACT

A display substrate comprises a base substrate and a first metal layer, a second metal layer, a first electrode pattern, a second electrode pattern, a first insulating layer and a second insulating layer formed above the base substrate. The first insulating layer is located over the first metal layer, the second insulating layer is located above the first insulating layer, the first electrode pattern and the second metal layer are located between the first insulating layer and the second insulating layer; a via hole is arranged at a position directly above the first metal layer to which the first insulating layer and the second insulating layer correspond, one end of the first electrode pattern is connected with the second metal layer, the other end extends into the via hole, the second (Continued)

electrode pattern is in the via hole and connected with the first electrode pattern and the first metal layer.

14 Claims, 7 Drawing Sheets

(51) Int. Cl.
    *G02F 1/1362*      (2006.01)
    *H01L 23/50*      (2006.01)
    *H01L 27/02*      (2006.01)
    *H01L 29/417*      (2006.01)
    *H01L 21/768*      (2006.01)

(52) U.S. Cl.
    CPC ........ *H01L 21/76804* (2013.01); *H01L 23/50* (2013.01); *H01L 27/02* (2013.01); *H01L 29/41725* (2013.01); *H01L 2224/18* (2013.01)

(56) References Cited

U.S. PATENT DOCUMENTS

| | | | |
|---|---|---|---|
| 2011/0304060 A1* | 12/2011 | Qin | H01L 23/522 257/786 |
| 2012/0287364 A1* | 11/2012 | Peng | H01L 29/4908 349/43 |
| 2016/0005799 A1* | 1/2016 | Wang | H01L 29/66969 257/40 |
| 2016/0252793 A1* | 9/2016 | Cheng | H01L 29/78669 257/72 |
| 2016/0254284 A1* | 9/2016 | Zhao | H01L 21/77 257/72 |
| 2016/0358937 A1* | 12/2016 | Qu | H01L 27/1225 |
| 2017/0003529 A1* | 1/2017 | Liu | G02F 1/136227 |

FOREIGN PATENT DOCUMENTS

| | | |
|---|---|---|
| CN | 104678671 | 6/2015 |
| CN | 204557028 | 8/2015 |
| JP | 2011-212869 | 10/2011 |

* cited by examiner

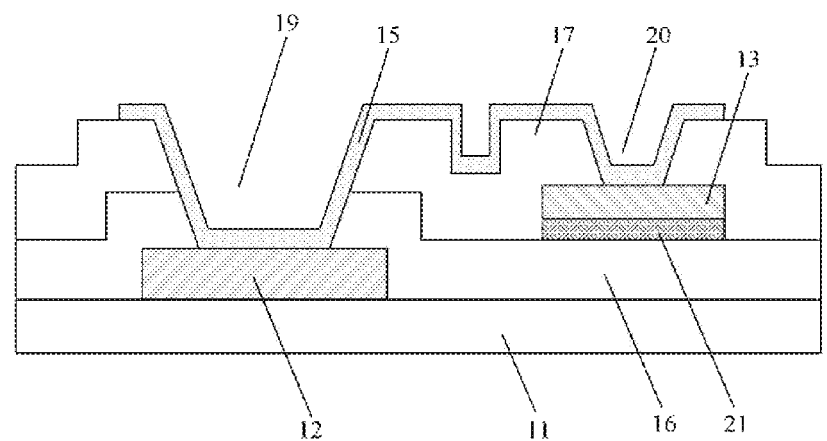
Fig. 1 -prior art-
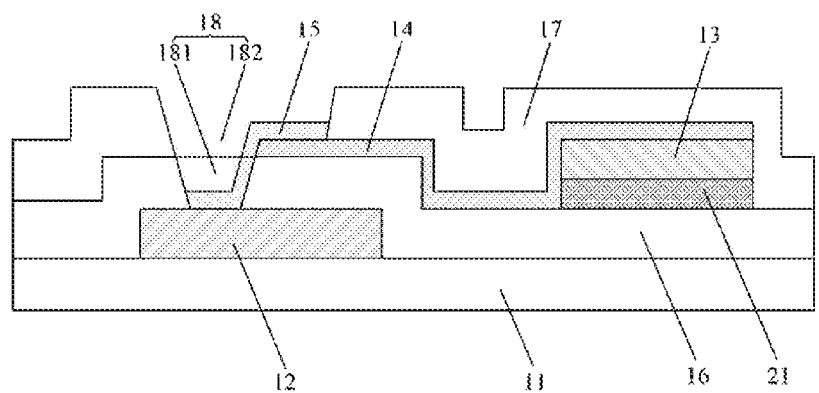
Fig. 2

DISPLAY SUBSTRATE, MANUFACTURING METHOD THEREOF AND DISPLAY DEVICE

RELATED APPLICATIONS

The present application is the U.S. national phase entry of PCT/CN2015/087367, with an international filing date of Aug. 18, 2015, which claims the benefit of Chinese Patent Application No. 201510144882.3, filed on Mar. 30, 2015, the entire disclosure of which are incorporated herein by reference

FIELD OF THE INVENTION

The present invention relates to the field of display technology, particularly to a display substrate and a manufacturing method thereof as well as a display device.

BACKGROUND OF THE INVENTION

At present, in the technical field of thin film transistor liquid crystal display (TFT-LCD), the Advanced Super Dimension Switch (ADSDS) display device has been more and more widely applied. The high aperture ratio (H-ADSDS) display device is an important type of the ADSDS display device.

FIG. 1 is a structural schematic view of a H-ADSDS display substrate in the prior art, as shown in FIG. 1, the display substrate may comprise a base substrate 11 and a first metal layer 12, a second metal layer 13, a second electrode pattern 15, a first insulating layer 16, a second insulating layer 17 and an active layer 21 formed above the base substrate 11. The first insulating layer 16 is located over the first metal layer 12, the active layer 21 is located on the first insulating layer 16, the second metal layer 13 is located on the active layer 21, the second insulating layer 17 is located over the second metal layer 13, the second electrode pattern 15 is located on the second insulating layer 17, a first via hole 19 is arranged in the first insulating layer 16 and the second insulating layer 17 above the first metal layer 12, a second via hole 20 is arranged in the second insulating layer 17 above the second metal layer 13, part of the second electrode pattern 15 is arranged in the first via hole 19 and the second via hole 20 so as to connect the first metal layer 12 and the second metal layer 13.

In the prior art, the second electrode pattern 15 is used as the connection medium, and via hole process is performed at the corresponding positions of the metal layers that need to be connected, so as to realize conduction between the metal layers. However, the prior art has the following technical problems:

1) Two via holes are required to connect different metal layers, such that the distribution density of the via holes is too high, which may result in various disadvantageous phenomena in the subsequent process, for example, if the distribution density of the via holes is too high, mura will be formed due to nonuniform diffusion of the alignment film in the alignment film process, thereby increasing the probability of producing various disadvantageous phenomena in the subsequent process.

2) Since two via holes are required to connect different metal layers, the second electrode pattern 15 as the connection medium, except for part of its structure located in the two via holes, still has part of its structure located on the second insulating layer 17, such that the span distance of the second electrode pattern 15 is relatively large, the second electrode pattern 15 located at the steps and corners around the via holes is relatively fragile, which may easily result in corrosion in the process after the second electrode pattern is manufactured, particularly in the process of use after the product is manufactured, thereby the problems such as deterioration circuit break, poor circuit and abnormal display may easily occur.

SUMMARY OF THE INVENTION

The embodiments of the present invention provide a display substrate and a manufacturing method thereof as well as a display device, so as to mitigate or avoid the problems mentioned above.

According to an aspect of the present invention, an embodiment of the present invention provides a display substrate, comprising: a base substrate and a first metal layer, a second metal layer, a first electrode pattern, a second electrode pattern, a first insulating layer and a second insulating layer formed above the base substrate, the first insulating layer is located over the first metal layer, the second insulating layer is located above the first insulating layer, the first electrode pattern and the second metal layer are located between the first insulating layer and the second insulating layer; and a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer.

In an embodiment, the via hole may comprise a first sub via hole arranged in the first insulating layer and a second sub via hole arranged in the second insulating layer, the first sub via hole and the second sub via hole are fed through and the width of the second sub via hole is greater than the width of the first sub via hole; and a portion of the first electrode pattern located in the via hole is located in the second sub via hole and is located on the first insulating layer; moreover, one end of the second electrode pattern located in the via hole is located in the first sub via hole, the other end of the second electrode pattern located in the via hole is located in the second sub via hole and is located on the first electrode pattern.

In an embodiment, a side of the via hole close to the second metal layer may be in a step shape.

In an embodiment, the second metal layer may be located under the first electrode pattern, or the second metal layer may be located on the first electrode pattern.

In an embodiment, the first metal layer may be a gate metal layer, the second metal layer may be a source/drain metal layer; or, the first metal layer may be a source/drain metal layer, the second metal layer may be a gate metal layer.

According to another aspect of the present invention, an embodiment of the present invention provides a display device comprising a display substrate and an opposite substrate oppositely arranged, the display substrate can be a display substrate claimed provided by any of the above embodiments.

According to a further aspect of the present invention, an embodiment of the present invention provides a manufacturing method of a display substrate, comprising the steps of:

forming a first metal layer, a first insulating layer, a second metal layer, a first electrode pattern and a second insulating layer above a base substrate, the first insulating layer being located over the first metal layer, the second insulating layer being located above the first insulating layer, the first electrode pattern and the second metal layer being located between the first insulating layer and the second insulating layer, one end of the first electrode pattern being connected with the second metal layer;

forming a via hole at a position directly above the first metal layer to which the first insulating layer and the second insulating layer correspond, the other end of the first electrode pattern extending into the via hole; and forming a second electrode pattern above the base substrate, the second electrode pattern being located in the via hole and being connected with the first electrode pattern, the second electrode pattern being further connected with the first metal layer.

Further, the step of forming a first metal layer, a first insulating layer, a second metal layer, a first electrode pattern and a second insulating layer above a base substrate may comprise the steps of:

forming the first metal layer on the base substrate;
forming the first insulating layer over the first metal layer;
forming an active layer on the first insulating layer and the second metal layer located on the active layer;
forming the first electrode pattern on the second metal layer; and
forming the second insulating layer over the first electrode pattern.

Alternatively, the step of forming a first metal layer, a first insulating layer, a second metal layer, a first electrode pattern and a second insulating layer above a base substrate may comprise the steps of:

forming the first metal layer on the base substrate;
forming the first insulating layer over the first metal layer;
forming an active layer on the first insulating layer;
forming the first electrode pattern above the base substrate;
forming the second metal layer on the first electrode pattern; and
forming the second insulating layer over the second metal layer.

Further, the via hole comprises a first sub via hole arranged in the first insulating layer and a second sub via hole arranged in the second insulating layer, the first sub via hole and the second sub via hole are fed through and the width of the second sub via hole is greater than the width of the first sub via hole; and a portion of the first electrode pattern located in the via hole is located in the second sub via hole and is located on the first insulating layer; moreover, one end of the second electrode pattern located in the via hole is located in the first sub via hole, the other end of the second electrode pattern located in the via hole is located in the second sub via hole and is located on the first electrode pattern.

In the technical solutions of the display substrate and the manufacturing method thereof as well as the display device provided by the embodiments of the present invention, a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer, so as to realize connection of the first metal layer and the second metal layer. The embodiments of the present invention adopt one via hole to connect different metal layers, which reduces the distribution density of the via hole, thereby reducing the probability of producing various disadvantageous phenomena in the subsequent process. In the embodiments of the present invention, only one via hole is used to connect different metal layers and the second electrode pattern as the connection medium is located in the via hole, such that the second electrode pattern does not have to be located at the step and the corner around the via hole, which can mitigate or avoid the phenomenon of corrosion of the second electrode pattern caused by the step and the corner around the via hole, thereby mitigating or avoiding the problems such as deterioration circuit break of the second electrode pattern, poor circuit and abnormal display.

BRIEF DESCRIPTION OF THE DRAWINGS

FIG. 1 is a structural schematic view of a H-ADSDS display substrate in the prior art;

FIG. 2 is a structural schematic view of a display substrate provided by an embodiment of the present invention;

DETAILED DESCRIPTION OF THE INVENTION

Figure 3:
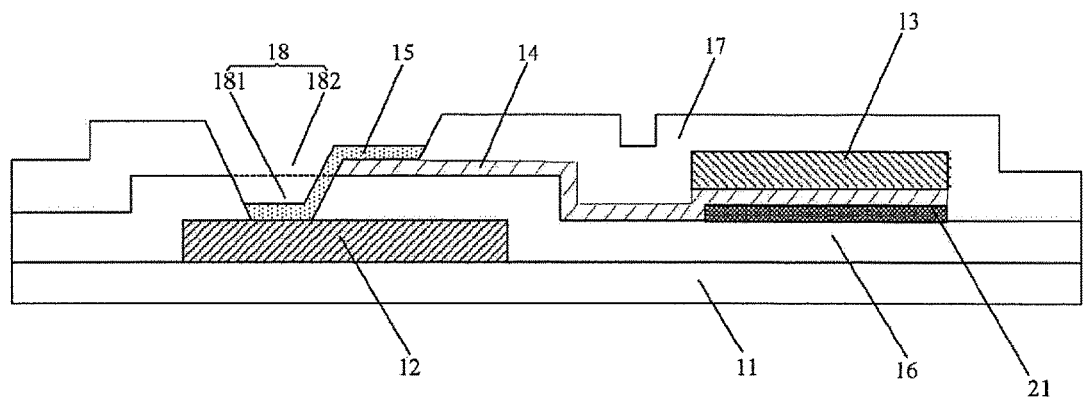
FIG. 3 is a structural schematic view of a display substrate provided by another embodiment of the present invention.

In order to enable the skilled person in the art to understand the technical solution of the present invention better, next, the embodiments of the display substrate and the manufacturing method thereof as well as the display device provided by the present invention will be described in detail with reference to the drawings.

FIG. 2 is a structural schematic view of a display substrate provided by an embodiment of the present invention, as shown in FIG. 2, the display substrate comprises: a base substrate 11 and a first metal layer 12, a second metal layer 13, a first electrode pattern 14, a second electrode pattern 15, a first insulating layer 16 and a second insulating layer 17 formed above the base substrate 11. The first insulating layer 16 is located over the first metal layer 12, the second insulating layer 17 is located above the first insulating layer 16, and the first electrode pattern 14 and the second metal layer 13 are located between the first insulating layer 16 and the second insulating layer 17. A via hole 18 is arranged at a position directly above the first metal layer 12 to which the first insulating layer 16 and the second insulating layer 17 correspond, one end of the first electrode pattern 14 is connected with the second metal layer 13, the other end of the first electrode pattern 14 extends into the via hole 18, the second electrode pattern 15 is located in the via hole 18 and is connected with the first electrode pattern 14, the second electrode pattern 15 is further connected with the first metal layer 12.

In this embodiment, the first electrode pattern 14 is connected with the second electrode pattern 15 and the second metal layer 13 respectively, and the second electrode pattern 15 is connected with the first metal layer 12, thereby realizing connection of the first metal layer 12 and the second metal layer 13.

In an embodiment, the via hole 18 may comprise a first sub via hole 181 arranged in the first insulating layer 16 and a second sub via hole 182 arranged in the second insulating layer 17, the first sub via hole 181 and the second sub via hole 182 are fed through and the width of the second sub via hole 182 is greater than the width of the first sub via hole 181. A portion of the first electrode pattern 14 located in the via hole 18 is located in the second sub via hole 182 and is located above the first insulating layer 16. One end of the second electrode pattern 15 located in the via hole 18 is located in the first sub via hole 181, the other end of the second electrode pattern 15 located in the via hole 18 is located in the second sub via hole 182 and is located on the first electrode pattern 14. It needs to be explained that, the broken line in the via hole 18 of FIG. 2 is used for separating the first sub via hole 181 and the second sub via hole 182.

In an embodiment, a side of the via hole 18 close to the second metal layer 13 can be in a step shape. The via hole in a step shape can avoid usage of a deep hole (i.e., a via hole with a relatively large depth) tunneling through the first insulating layer and the second insulating layer directly, thereby being capable of mitigating or avoiding various disadvantageous phenomena in the subsequent process caused by over large depth of the deep hole, e.g., mura formed by nonuniform diffusion of the alignment film in the alignment film process may be avoided, and occurrence of electrode layer chamfer can be prevented effectively, so as to mitigate or avoid occurrence of circuit break.

In an embodiment, the second metal layer 13 may be located under the first electrode pattern 14. Specifically, the second metal layer 13 is located above the first insulating layer 16, part of the first electrode pattern 14 is located on the second metal layer 13 and part is located on the first insulating layer 16.

In an embodiment, the first metal layer 12 may be a gate metal layer, the second metal layer 13 may be a source/drain metal layer. Alternatively, in actual applications, the first metal layer 12 can also be a source/drain metal layer, the second metal layer 13 can also be a gate metal layer, such a case will not be shown in the figure specifically.

Further, the display substrate may further comprise an active layer 12. The active layer 21 can be located under the second metal layer 13, and located on the first insulating layer 16.

In an embodiment, the first electrode pattern 14 can be located in the first electrode layer, the first electrode layer can comprise a structure being the connection medium and a structure for generating an electric field, the structure being the connection medium is the first electrode pattern 14, FIG. 2 only shows the first electrode pattern 14, the structure for generating an electric field is well known in the art, which will not be illustrated here.

In an embodiment, the second electrode pattern 15 can be located in the second electrode layer, the second electrode layer can comprise a structure being the connection medium and a structure for generating an electric field, the structure as the connection medium is the second electrode pattern 15, FIG. 2 only shows the second electrode pattern 15, the structure for generating an electric field is well known in the art, which will not be illustrated here.

In an embodiment, the materials of the first electrode pattern 14 and the second electrode pattern 15 can be transparent conductive materials, e.g., indium tin oxide (ITO).

In the display substrate provided by this embodiment, a via hole is arranged at a position directly above the first metal layer to which the first insulating layer and the second insulating layer correspond, one end of the first electrode pattern extends into the via hole, the other end of the first electrode pattern is connected with the second metal layer, the second electrode pattern is located in the via hole and is connected with the first electrode pattern, the second electrode pattern is further connected with the first metal layer, so as to realize connection of the first metal layer and the second metal layer. This embodiment adopts one via hole to connect different metal layers, which can reduce the distribution density of the via hole, thereby being capable of reducing the probability of producing various disadvantageous phenomena in the subsequent process. In this embodiment, only one via hole is used to connect different metal layers and the second electrode pattern as the connection medium is located in the via hole, such that the second electrode pattern does not have to be located at the step and the corner around the via hole, which can mitigate or avoid the phenomenon of corrosion of the second electrode pattern caused by the step and the corner around the via hole, thereby mitigating or avoiding the problems such as deterioration circuit break of the second electrode pattern, poor circuit and abnormal display. Therefore, this embodiment has better effects in both reliability experiment and yield.

FIG. 3 is a structural schematic view of a display substrate provided by another embodiment of the present invention, as shown in FIG. 3, the display substrate may comprise: a base substrate 11 and a first metal layer 12, a second metal layer 13, a first electrode pattern 14, a second electrode pattern 15, a first insulating layer 16 and a second insulating layer 17 formed above the base substrate 11, the first insulating layer 16 is located over the first metal layer 12, the second insulating layer 17 is located above the first insulating layer 16, the first electrode pattern 14 and the second metal layer 13 are located between the first insulating layer 16 and the second insulating layer 17. A via hole 18 is arranged at a position directly above the first metal layer 12 to which the first insulating layer 16 and the second insulating layer 17 correspond, one end of the first electrode pattern 14 is extends into the via hole 18, the other end of the first electrode pattern 14 is connected with the second metal layer 13, the second electrode pattern 15 is located in the via hole 18 and is connected with the first electrode pattern 14, the second electrode pattern 15 is further connected with the first metal layer 12.

In this embodiment, the first electrode pattern 14 is connected with the second electrode pattern 15 and the second metal layer 13 respectively, and the second electrode pattern 15 is connected with the first metal layer 12, thereby realizing connection of the first metal layer 12 and the second metal layer 13.

In an embodiment, the via hole 18 may comprise a first sub via hole 181 arranged in the first insulating layer 16 and a second sub via hole 182 arranged in the second insulating layer 17, the first sub via hole 181 and the second sub via hole 182 are fed through and the width of the second sub via hole 182 is greater than the width of the first sub via hole 181. A portion of the first electrode pattern 14 located in the via hole 18 is located in the second sub via hole 182 and is located on the first insulating layer 16. One end of the second electrode pattern 15 located in the via hole 18 is located in the first sub via hole 181, the other end of the second electrode pattern 15 located in the via hole 18 is located in the second sub via hole 182 and is located on the first electrode pattern 14. It needs to be explained that, the broken line in the via hole 18 of FIG. 2 is used for separating the first sub via hole 181 and the second sub via hole 182.

In an embodiment, a side of the via hole 18 close to the second metal layer 13 may be in a step shape. The via hole in a step shape can avoid usage of a deep hole (i.e., a via hole with a relatively large depth) tunneling through the first insulating layer and the second insulating layer directly, thereby being capable of mitigating or avoiding various disadvantageous phenomena in the subsequent process caused by over large depth of the deep hole, e.g., mura formed by nonuniform diffusion of the alignment film in the alignment film process can be avoided, and occurrence of electrode layer chamfer can be prevented effectively, so as to mitigate or avoid occurrence of circuit break.

In this embodiment, the second metal layer 13 may be located on the first electrode pattern 14. Specifically, the first electrode pattern 14 may be located on the first insulating layer 16, the second insulating layer 17 may be located on the second metal layer 13.

In an embodiment, the first metal layer 12 is a gate metal layer, the second metal layer 13 is a source/drain metal layer. Alternatively, in actual applications, the first metal layer 12 can also be a source/drain metal layer, the second metal layer 13 can also be a gate metal layer, such a case will not be shown in the figure specifically.

Further, the display substrate may further comprise an active layer 12. The active layer 21 can be located on the first insulating layer 16, and located under the first electrode pattern 14.

In an embodiment, the first electrode pattern 14 can be located in the first electrode layer, the first electrode layer can comprise a structure as the connection medium and a structure for generating an electric field, the structure as the connection medium is the first electrode pattern 14, FIG. 3 only shows the first electrode pattern 14, the structure for generating an electric field is well known in the art, which will not be shown specifically here.

In an embodiment, the second electrode pattern 15 can be located in the second electrode layer, the second electrode layer can comprise a structure as the connection medium and a structure for generating an electric field, the structure as the connection medium is the second electrode pattern 15, FIG. 3 only shows the second electrode pattern 15, the structure for generating an electric field is well known in the art, which will not be shown specifically here.

In an embodiment, the materials of the first electrode pattern 14 and the second electrode pattern 15 can be transparent conductive materials, e.g., indium tin oxide (ITO).

In the display substrate provided by this embodiment, a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer, so as to realize connection of the first metal layer and the second metal layer. This embodiment adopts one via hole to connect different metal layers, which can reduce the distribution density of the via hole, thereby being capable of reducing the probability of producing various disadvantageous phenomena in the subsequent process. In this embodiment, only one via hole is used to connect different metal layers and the second electrode pattern as the connection medium is located in the via hole, such that the second electrode pattern does not have to be located at the step and the corner around the via hole, which can mitigate or avoid the phenomenon of corrosion of the second electrode pattern caused by the step and the corner around the via hole, thereby mitigating or avoiding the problems such as deterioration circuit break of the second electrode pattern, poor circuit and abnormal display. Therefore, this embodiment has better effects in both reliability experiment and yield.

Another embodiment of the present invention provides a display device, comprising a display substrate and an opposite substrate oppositely arranged, the display substrate can be a display substrate provided by any of the above embodiments.

In an embodiment, the display substrate can be an array substrate, the opposite substrate can be a color film substrate.

In the display device provided by this embodiment, a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer, so as to realize connection of the first metal layer and the second metal layer. This embodiment adopts one via hole to connect different metal layers, which can reduce the distribution density of the via hole, thereby being capable of reducing the probability of producing various disadvantageous phenomena in the subsequent process. In this embodiment, only one via hole is used to connect different metal layers and the second electrode pattern as the connection medium is located in the via hole, such that the second electrode pattern does not have to be located at the step and the corner around the via hole, which can mitigate or avoid the phenomenon of corrosion of the second electrode pattern caused by the step and the corner around the via hole, thereby mitigating or avoiding the problems such as deterioration circuit break of the second electrode pattern, poor circuit and abnormal display. Therefore, this embodiment has better effects in both reliability experiment and yield.

A further embodiment of the present invention provides a manufacturing method of a display substrate, the method may comprise the following steps.

Step 101, forming a first metal layer, a first insulating layer, a second metal layer, a first electrode pattern and a second insulating layer above a base substrate, the first insulating layer being located over the first metal layer, the second insulating layer being located above the first insulating layer, the first electrode pattern and the second metal layer being located between the first insulating layer and the second insulating layer, one end of the first electrode pattern being connected with the second metal layer.

Figure 4A:
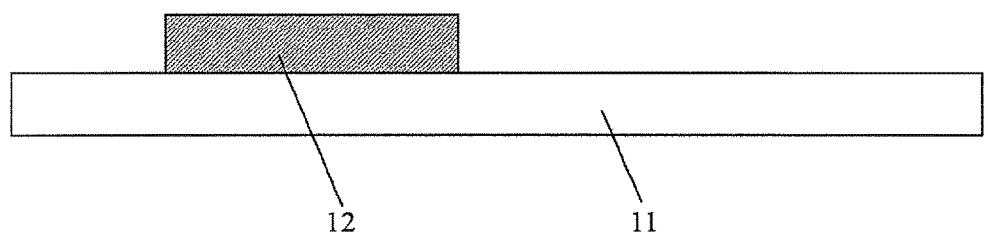
FIG. 4a is a schematic view of forming a first metal layer in another embodiment of the present invention.

Specifically, the step 101 may comprise steps of:

Step 1011, forming a first metal layer on a base substrate. FIG. 4a is a schematic view of forming a first metal layer in an embodiment, as shown in FIG. 4a, a first metal material layer can be formed on the base substrate 11, patterning process is performed for the first metal material layer to form a first metal layer 12 on the base substrate 11.

Figure 4B:
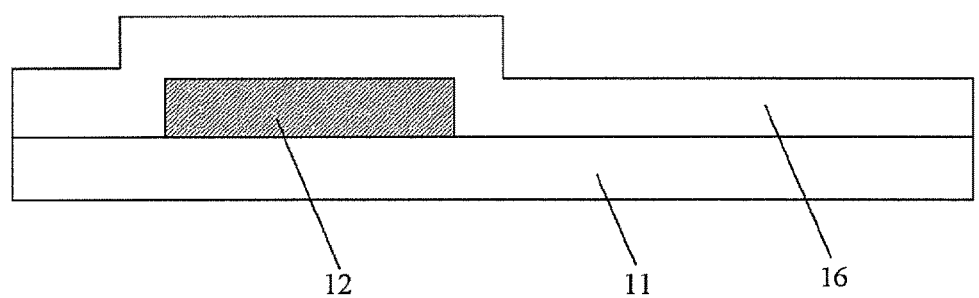
FIG. 4b is a schematic view of forming a first insulating layer in another embodiment of the present invention.

Step 1012, forming a first insulating layer over the first metal layer. FIG. 4b is a schematic view of forming a first insulating layer in an embodiment, as shown in FIG. 4b, a first insulating layer 16 can be deposited over the first metal layer 12.

Figure 4C:
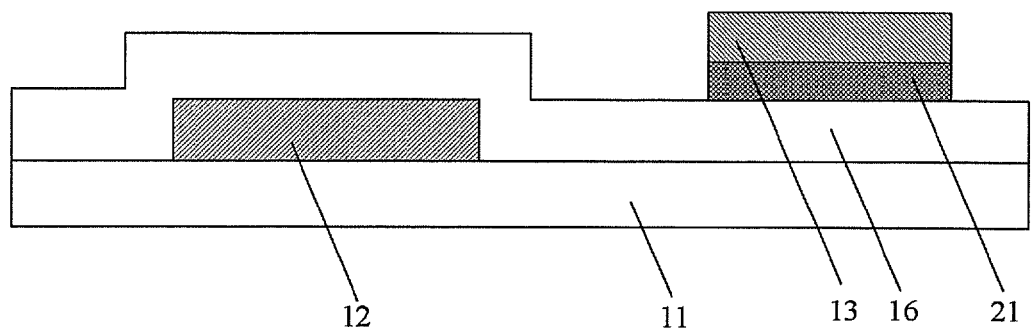
FIG. 4c is a schematic view of forming a second metal layer in another embodiment of the present invention.

Step 1013, forming an active layer on the first insulating layer and a second metal layer located on the active layer. FIG. 4c is a schematic view of forming a second metal layer in an embodiment, as shown in FIG. 4c, an active layer 21 and a second metal layer 13 can be formed on the first insulating layer 16 through a patterning process. Specifically, an active material layer and a second metal material layer can be deposited successively on the first insulating layer 16, the active layer 21 and the second metal layer 13 can be formed on the first insulating layer 16 by performing patterning process for the active material layer and the second metal material layer. The active layer 21 and the second metal layer 13 can be formed through one patterning process.

Figure 4D:
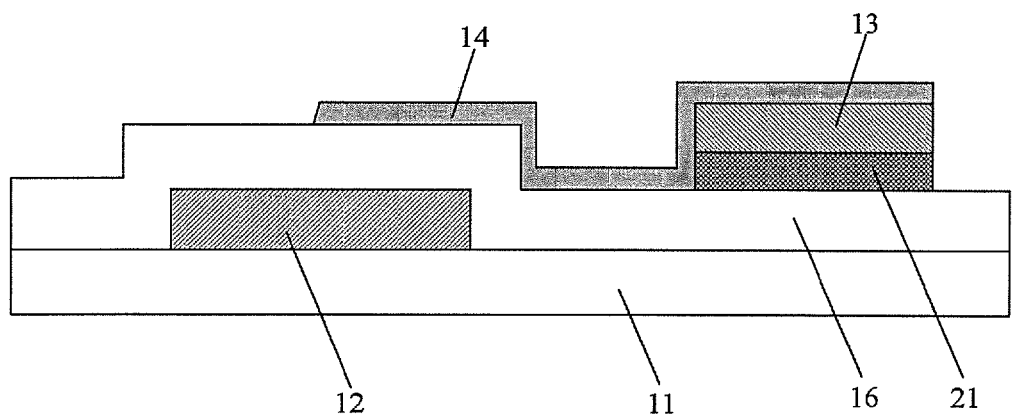
FIG. 4d is a schematic view of forming a first electrode pattern in another embodiment of the present invention.

Step 1014, forming a first electrode pattern on the second metal layer. FIG. 4d is a schematic view of forming a first electrode pattern in an embodiment, as shown in FIG. 4d, a first electrode pattern material layer is formed above the base substrate 11, a first electrode pattern 14 may be formed above the base substrate 11 by performing patterning process for the first electrode pattern material layer. Part of the first electrode pattern 14 is located on the second metal layer 13 and part is located above the first metal layer 12.

Figure 4E:
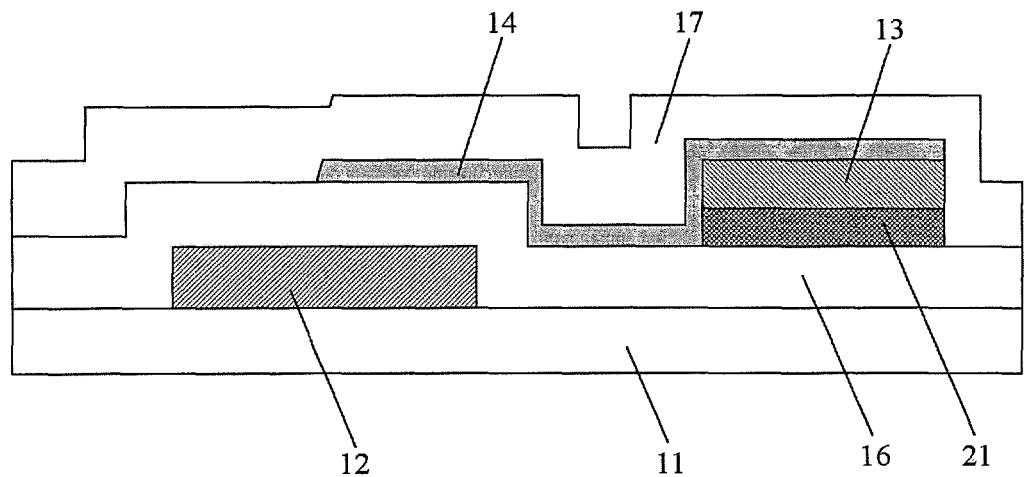
FIG. 4e is a schematic view of forming a second insulating layer in another embodiment of the present invention.

Step 1015, forming a second insulating layer on the first electrode pattern. FIG. 4e is a schematic view of forming a second insulating layer in an embodiment, as shown in FIG. 4e, a second insulating layer 17 is deposited on the first electrode pattern 14.

Step 102, forming a via hole at a position directly above the first metal layer to which the first insulating layer and the second insulating layer correspond, the other end of the first electrode pattern extending into the via hole.

Figure 4F:
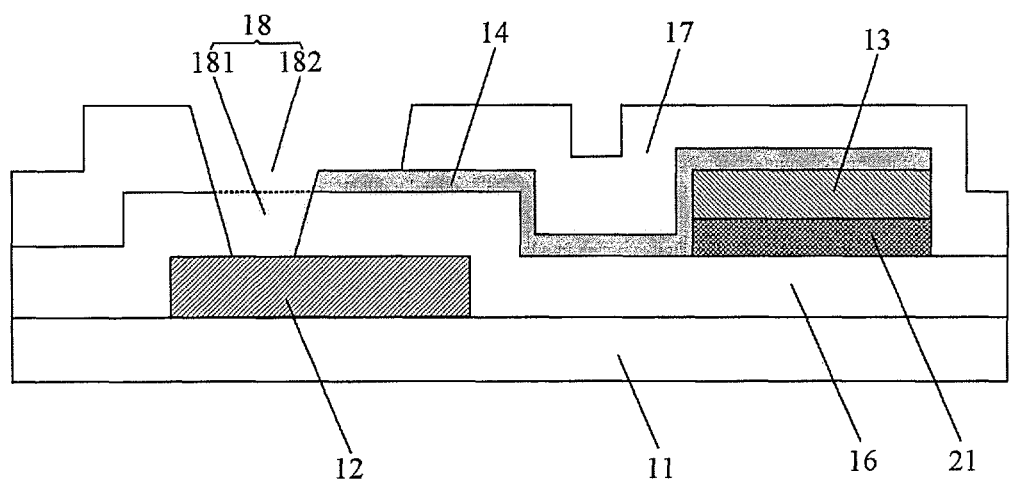
FIG. 4f is a schematic view of forming a via hole in another embodiment of the present invention.

FIG. 4f is a schematic view of forming a via hole in an embodiment, as shown in FIG. 4f, a via hole 18 may be formed by performing patterning process for the first insulating layer 16 and the second insulating layer 17, a portion of the first electrode pattern 14 is located in the via hole 18. In the embodiment, the via hole 18 can be formed through one patterning process. In this embodiment, the via hole 18 comprises a first sub via hole 181 arranged in the first insulating layer 16 and a second sub via hole 182 arranged in the second insulating layer 17, the first sub via hole 181 and the second sub via hole 182 are fed through and the width of the second sub via hole 182 is greater than the width of the first sub via hole 181; the portion of the first electrode pattern 14 located in the via hole 18 is located in the second sub via hole 182 and located on the first insulating layer 16. In the via hole 18, due to the shielding function of the portion of the first electrode pattern 14, the side of the via hole 18 close to the second metal layer 13 may be in a step shape.

Step 103, forming a second electrode pattern above the base substrate, the second electrode pattern being located in the via hole and being connected with the first electrode pattern, the second electrode pattern being further connected with the first metal layer.

As shown in FIG. 2, a second electrode pattern material layer may be formed on the second insulating layer 17, a second electrode pattern 15 may be formed above the base substrate 11 by performing patterning process for the second electrode pattern material layer. The second electrode pattern 15 is located in the via hole 18 and is connected with the first electrode pattern 14, the second electrode pattern 15 is further connected with the first metal layer 12, thereby realizing connection of the first metal layer 12 and the second metal layer 13.

In the above embodiments, step 1011, step 1013, step 1014, step 102 and step 103 can all be carried out through the patterning process.

The manufacturing method of a display substrate provided by this embodiment can be used for manufacturing the display substrate provided by the embodiment as shown in FIG. 2, specific description about the display substrate may refer to the preceding embodiments, which will not be repeated here.

In the display substrate manufactured by using the manufacturing method of a display substrate provided by this embodiment, a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer, so as to realize connection of the first metal layer and the second metal layer. This embodiment adopts one via hole to connect different metal layers, which can reduce the distribution density of the via hole, thereby being capable of reducing the probability of producing various disadvantageous phenomena in the subsequent process. In this embodiment, only one via hole is used to connect different metal layers and the second electrode pattern as the connection medium is located in the via hole, such that the second electrode pattern does not have to be located at the step and the corner around the via hole, which can mitigate or avoid the phenomenon of corrosion of the second electrode pattern caused by the step and the corner around the via hole, thereby mitigating or avoiding the problems such as deterioration circuit break of the second electrode pattern, poor circuit and abnormal display. Therefore, this embodiment has better effects in both reliability experiment and yield.

A further embodiment of the present invention provides another manufacturing method of a display substrate, the method may comprise the following steps.

Step 201, forming a first metal layer, a first insulating layer, a second metal layer, a first electrode pattern and a second insulating layer above a base substrate, the first insulating layer being located above the first metal layer, the second insulating layer being located above the first insulating layer, the first electrode pattern and the second metal layer being located between the first insulating layer and the second insulating layer, one end of the first electrode pattern being connected with the second metal layer. Specifically, the step 201 may comprise the following steps.

Figure 5A:
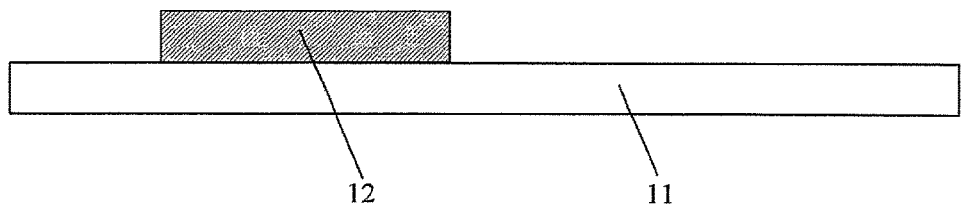
FIG. 5a is a schematic view of forming a first metal layer in a further embodiment of the present invention.

Step 2011, forming the first metal layer on the base substrate. FIG. 5a is a schematic view of forming a first metal layer in an embodiment, as shown in FIG. 5a, a first metal material layer can be formed on the base substrate 11, patterning process may be performed for the first metal material layer to form a first metal layer 12 on the base substrate 11.

Figure 5B:
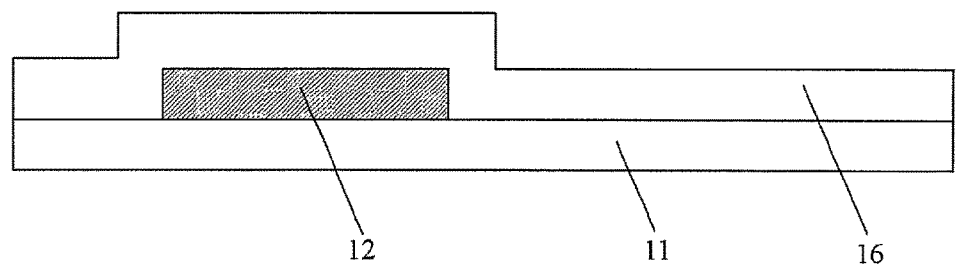
FIG. 5b is a schematic view of forming a first insulating layer in a further embodiment of the present invention.

Step 2012, forming a first insulating layer over the first metal layer. FIG. 5b is a schematic view of forming a first insulating layer in an embodiment, as shown in FIG. 5b, a first insulating layer 16 may be deposited over the first metal layer 12.

Figure 5C:
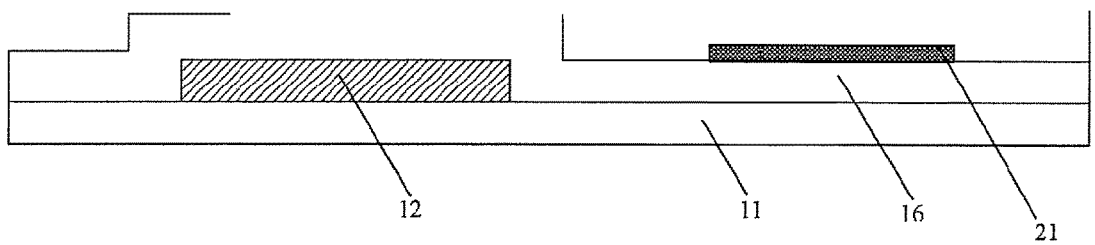
FIG. 5c is a schematic view of forming an active layer in a further embodiment of the present invention.

Step 2013, forming an active layer on the first insulating layer. Specifically, as shown in FIG. 5c, an active material layer can be formed on the first insulating layer 16, patterning process may be performed for the active material layer to form an active layer 21.

Figure 5D:
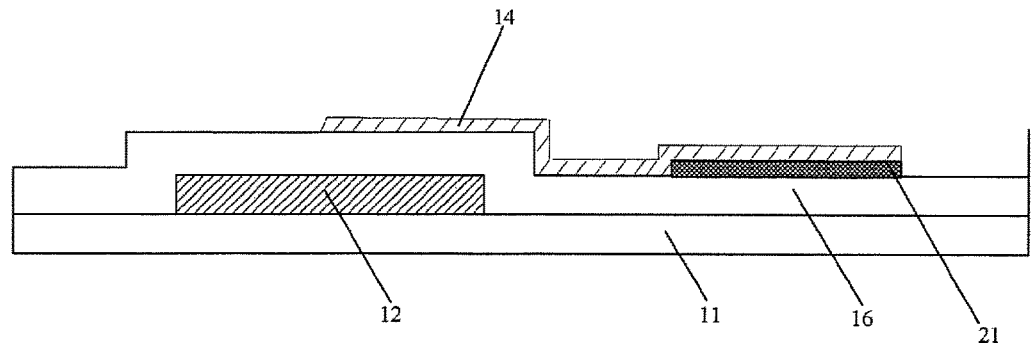
FIG. 5d is a schematic view of forming a first electrode pattern in a further embodiment of the present invention.

Step 2014, forming a first electrode pattern above the base substrate. FIG. 5d is a schematic view of forming a first electrode pattern in an embodiment, as shown in FIG. 5d, a first electrode pattern material layer is formed above the base substrate 11, a first electrode pattern 14 is formed above the base substrate by performing patterning process for the first electrode pattern material layer. The first electrode pattern 14 may be located above the first insulating layer 16 and can cover the active layer 21.

Figure 5E:
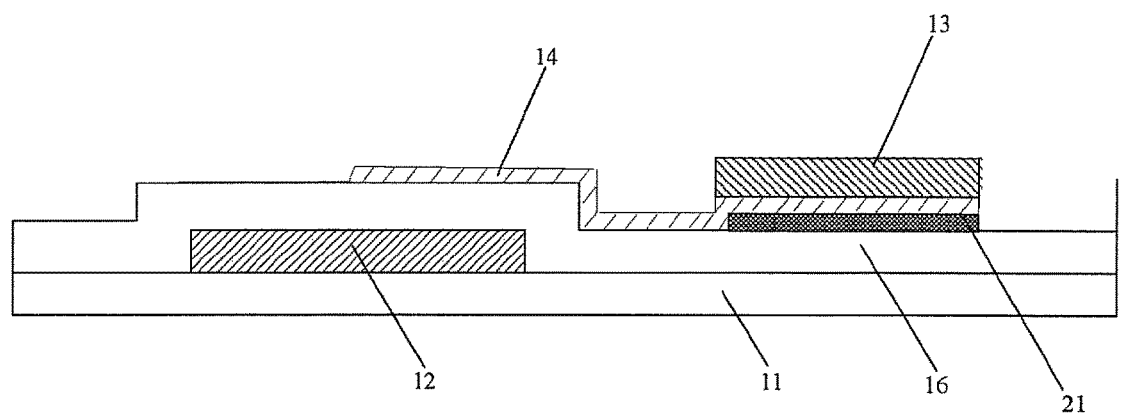
FIG. 5e a schematic view of forming a second metal layer in a further embodiment of the present invention.

Step 2015, forming a second metal layer on the first electrode pattern. FIG. 5e is a schematic view of forming a second metal layer in an embodiment, as shown in FIG. 5e, a second metal layer 13 can be formed on the first electrode pattern 14 through patterning process. For example, a second metal material layer can be deposited on the first electrode pattern 14, the second metal layer 13 may be formed on the first electrode pattern 14 by performing patterning process for the second metal material layer.

Figure 5F:
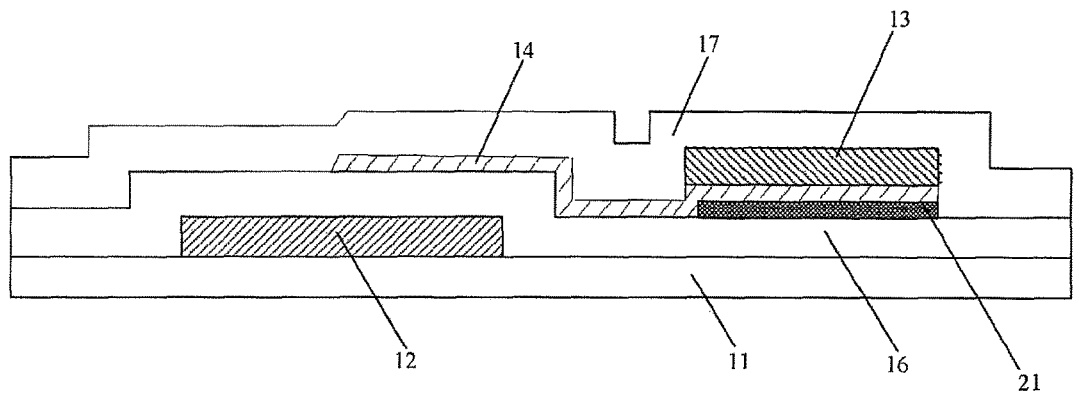
FIG. 5f is a schematic view of forming a second insulating layer in a further embodiment of the present invention.

Step 2016, forming a second insulating layer over the second metal layer. FIG. 5f is a schematic view of forming a second insulating layer in an embodiment, as shown in FIG. 5f, a second insulating layer 17 can be deposited over the second metal layer 13.

Step 202, forming a via hole in the first insulating layer and the second insulating layer above the first metal layer, a portion of the first electrode pattern being located in the via hole.

Figure 5G:
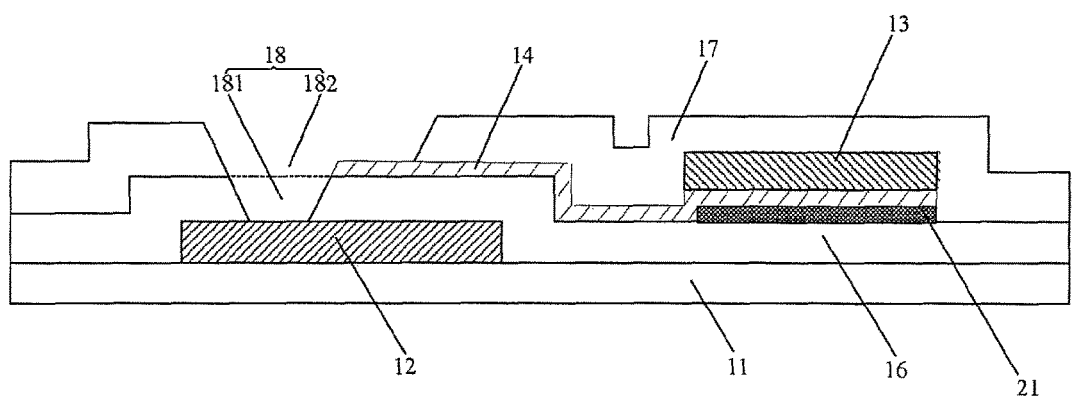
FIG. 5g is a schematic view of forming a via hole in a further embodiment of the present invention.

FIG. 5g is a schematic view of forming a via hole in an embodiment, as shown in FIG. 5g, a via hole 18 can be formed by performing patterning process to the first insulating layer 16 and the second insulating layer 17, a portion of the first electrode pattern 14 is located in the via hole 18. In the embodiment, the via hole 18 can be formed through one patterning process. In this embodiment, the via hole 18 comprises a first sub via hole 181 arranged in the first insulating layer and a second sub via hole 182 arranged in the second insulating layer 17, the first sub via hole 181 and the second sub via hole 182 are fed through and the width of the second sub via hole 182 is greater than the width of the first sub via hole 181; the portion of the first electrode pattern 14 located in the via hole 18 is located in the second sub via hole 182 and located on the first insulating layer 16. In the via hole 18, due to the shielding function of the portion of the first electrode pattern 14, the side of the via hole 18 close to the second metal layer 13 may be in a step shape.

Step 203, forming a second electrode pattern above the base substrate, the second electrode pattern being located in the via hole and being connected with the first electrode pattern, the second electrode pattern being further connected with the first metal layer.

As shown in FIG. 3, a second electrode pattern material layer may be formed on the second insulating layer 17, a second electrode pattern 15 may be formed above the base substrate 11 by performing patterning process to the second electrode pattern material layer. The second electrode pattern 15 is located in the via hole 18 and is connected with the first electrode pattern 14, the second electrode pattern 15 is further connected with the first metal layer 12, thereby realizing connection of the first metal layer 12 and the second metal layer 13.

In this embodiment, step 2011, step 2013, step 2014, step 2015, step 202 and step 203 can all be carried out through the patterning process.

The manufacturing method of a display substrate provided by this embodiment can be used for manufacturing the display substrate provided by the embodiment as shown in FIG. 3, specific description about the display substrate may refer to the preceding embodiments, which will not be repeated here.

In the display substrate manufactured by using the manufacturing method of a display substrate provided by this embodiment, a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer, so as to realize connection of the first metal layer and the second metal layer. This embodiment adopts one via hole to connect different metal layers, which can reduce the distribution density of the via hole, thereby being capable of reducing the probability of producing various disadvantageous phenomena in the subsequent process. In this embodiment, only one via hole is used to connect different metal layers and the second electrode pattern as the connection medium is located in the via hole, such that the second electrode pattern does not have to be located at the step and the corner around the via hole, which can mitigate or avoid the phenomenon of corrosion of the second electrode pattern caused by the step and the corner around the via hole, thereby mitigating or avoiding the problems such as deterioration circuit break of the second electrode pattern, poor circuit and abnormal display. Therefore, this embodiment has better effects in both reliability experiment and yield.

It can be understood that the above embodiments are only exemplary implementations for explaining the principle of the present invention, however, the present invention is not limited to these. For the ordinary skilled person in the art, various modifications and improvements can be made without departing from the spirit and essence of the present invention, these modifications and improvements should also be regarded as the protection scope of the present invention.

In the claims, the word "comprise" does not exclude existence of elements or steps other than those listed in the claims. The word "a" or "an" preceding the element does not exclude existence of a plurality of such elements. The mere fact that some features are stated in mutually different dependent claims does not mean that the combination of these features cannot be used advantageously.

The invention claimed is:

1. A display substrate comprising:
a base substrate and a first metal layer, a second metal layer, a first electrode pattern, a second electrode pattern, a first insulating layer and a second insulating layer formed above the base substrate,
wherein the first insulating layer is located over the first metal layer, the second insulating layer is located above the first insulating layer, the first electrode pattern and the second metal layer are located between the first insulating layer and the second insulating layer;
and wherein a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer.

2. The display substrate according to claim 1, wherein the via hole comprises a first sub via hole arranged in the first insulating layer and a second sub via hole arranged in the second insulating layer, the first sub via hole and the second sub via hole are fed through and the width of the second sub via hole is greater than the width of the first sub via hole;
wherein a portion of the first electrode pattern located in the via hole is located in the second sub via hole and is located on the first insulating layer;
wherein one end of the second electrode pattern located in the via hole is located in the first sub via hole, the other end of the second electrode pattern located in the via hole is located in the second sub via hole and is located on the first electrode pattern.

3. The display substrate according to claim 2, wherein a side of the via hole close to the second metal layer is in a step shape.

4. The display substrate according to claim 1, wherein the second metal layer is located under the first electrode pattern, or the second metal layer is located on the first electrode pattern.

5. The display substrate according to claim 1, wherein the first metal layer is a gate metal layer, the second metal layer is a source/drain metal layer; or,
the first metal layer is a source/drain metal layer, the second metal layer is a gate metal layer.

6. A display device comprising a display substrate and an opposite substrate oppositely arranged, the display substrate comprising a base substrate and a first metal layer, a second metal layer, a first electrode pattern, a second electrode pattern, a first insulating layer and a second insulating layer formed above the base substrate,
wherein the first insulating layer is located over the first metal layer, the second insulating layer is located above the first insulating layer, the first electrode pattern and the second metal layer are located between the first insulating layer and the second insulating layer;
and wherein a via hole is arranged at a position directly above the first metal layer to which the first insulating layer and the second insulating layer correspond, one end of the first electrode pattern is connected with the second metal layer, the other end of the first electrode pattern extends into the via hole, the second electrode pattern is located in the via hole and is connected with the first electrode pattern, the second electrode pattern is further connected with the first metal layer.

7. The display substrate according to claim 6, wherein the via hole comprises a first sub via hole arranged in the first insulating layer and a second sub via hole arranged in the second insulating layer, the first sub via hole and the second sub via hole are fed through and the width of the second sub via hole is greater than the width of the first sub via hole;
wherein a portion of the first electrode pattern located in the via hole is located in the second sub via hole and is located on the first insulating layer;
wherein one end of the second electrode pattern located in the via hole is located in the first sub via hole, the other end of the second electrode pattern located in the via hole is located in the second sub via hole and is located on the first electrode pattern.

8. The display substrate according to claim 7, wherein a side of the via hole close to the second metal layer is in a step shape.

9. The display substrate according to claim 6, wherein the second metal layer is located under the first electrode pattern, or the second metal layer is located on the first electrode pattern.

10. The display substrate according to claim 6, wherein the first metal layer is a gate metal layer, the second metal layer is a source/drain metal layer; or,
the first metal layer is a source/drain metal layer, the second metal layer is a gate metal layer.

11. A manufacturing method of a display substrate, comprising:
forming a first metal layer, a first insulating layer, a second metal layer, a first electrode pattern and a second insulating layer above a base substrate, the first insulating layer being located over the first metal layer, the second insulating layer being located above the first insulating layer, the first electrode pattern and the second metal layer being located between the first insulating layer and the second insulating layer, one end of the first electrode pattern being connected with the second metal layer;
forming a via hole at a position directly above the first metal layer to which the first insulating layer and the second insulating layer correspond, the other end of the first electrode pattern extending into the via hole;
forming a second electrode pattern above the base substrate, the second electrode pattern being located in the via hole and being connected with the first electrode pattern, the second electrode pattern being further connected with the first metal layer.

12. The manufacturing method of a display substrate according to claim 11, wherein the step of forming a first metal layer, a first insulating layer, a second metal layer, a first electrode pattern and a second insulating layer above a base substrate comprises:
forming the first metal layer on the base substrate;
forming the first insulating layer over the first metal layer;
forming an active layer on the first insulating layer and the second metal layer located on the active layer;
forming the first electrode pattern on the second metal layer;
forming the second insulating layer over the first electrode pattern.

13. The manufacturing method of a display substrate according to claim 11, wherein the step of forming a first metal layer, a first insulating layer, a second metal layer, a first electrode pattern and a second insulating layer above a base substrate comprises:
forming the first metal layer on the base substrate;
forming the first insulating layer over the first metal layer;

forming an active layer on the first insulating layer;
forming the first electrode pattern above the base substrate;
forming the second metal layer on the first electrode pattern;
forming the second insulating layer over the second metal layer.

14. The manufacturing method of a display substrate according to claim 11, wherein the via hole comprises a first sub via hole arranged in the first insulating layer and a second sub via hole arranged in the second insulating layer, the first sub via hole and the second sub via hole are fed through and the width of the second sub via hole is greater than the width of the first sub via hole;
  wherein a portion of the first electrode pattern located in the via hole is located in the second sub via hole and is located on the first insulating layer;
  and wherein one end of the second electrode pattern located in the via hole is located in the first sub via hole, the other end of the second electrode pattern located in the via hole is located in the second sub via hole and is located on the first electrode pattern.

* * * * *